United States Patent

Yokosuka

Patent Number: 5,248,024
Date of Patent: Sep. 28, 1993

[54] WAFER MOUNTING DEVICE HAVING POSITION INDICATOR

[75] Inventor: Noriyoshi Yokosuka, Iruma, Japan

[73] Assignee: Enya Systems, Limited, Japan

[21] Appl. No.: 830,663

[22] Filed: Feb. 4, 1992

[30] Foreign Application Priority Data

Feb. 5, 1991 [JP] Japan ............... 2-0103285[U]

[51] Int. Cl.$^5$ .................. B23P 16/06; B65H 9/00
[52] U.S. Cl. ................... 198/341; 198/832.1; 269/63; 340/686; 414/744.2
[58] Field of Search ............... 116/298, 230; 318/626; 414/744.2, 223; 269/63; 156/636, 556; 235/462; 324/158 R; 198/341, 832.1, 345.2

[56] References Cited

U.S. PATENT DOCUMENTS

| | | | |
|---|---|---|---|
| 4,020,912 | 5/1977 | Hino et al. | 250/231 X |
| 4,054,202 | 10/1977 | Hautemont | 198/341 X |
| 4,372,802 | 2/1983 | Harigane et al. | 414/223 X |
| 4,412,609 | 11/1983 | Schieve | 198/341 |
| 4,677,604 | 6/1987 | Selby, III et al. | 235/462 X |
| 4,787,128 | 11/1988 | Wickham | 198/832.1 X |
| 4,819,923 | 4/1989 | Zumbusch | 269/63 |
| 4,936,559 | 6/1990 | Torga | 269/63 X |
| 4,960,485 | 10/1990 | Ichinosa et al. | 156/556 |
| 5,070,288 | 12/1991 | Ikeda et al. | 318/626 X |
| 5,096,854 | 3/1992 | Saito et al. | 156/636 X |

*Primary Examiner*—Daniel M. Yasich
*Attorney, Agent, or Firm*—Bruce L. Adams; Van C. Wilks

[57] ABSTRACT

A mount plate has a disc-shaped body having a wafer-mounting surface on which semiconductor wafers are to be mounted for polishing. The mount plate is carried by a rotary support which is rotatably indexed to different angular positions which correspond to angularly spaced locations on the wafer-mounting surface where the wafers are to be mounted. An indicator is embedded in the mount plate, preferably at the peripheral side edge thereof, and coacts with a sensor for indicating when the mount plate is indexed to a predetermined initial start position, thereby enabling automatic mounting of the wafers at the same locations on the wafer-mounting surface during each use of the mount plate. The indicator is preferably inserted in a recessed portion of the mount plate body and is covered by a transparent material so that the indicator is visible through the transparent material. The indicator may comprise a marking of a different color than the surrounding region of the mount body, alphanumeric characters, bar code indications or the like.

20 Claims, 1 Drawing Sheet

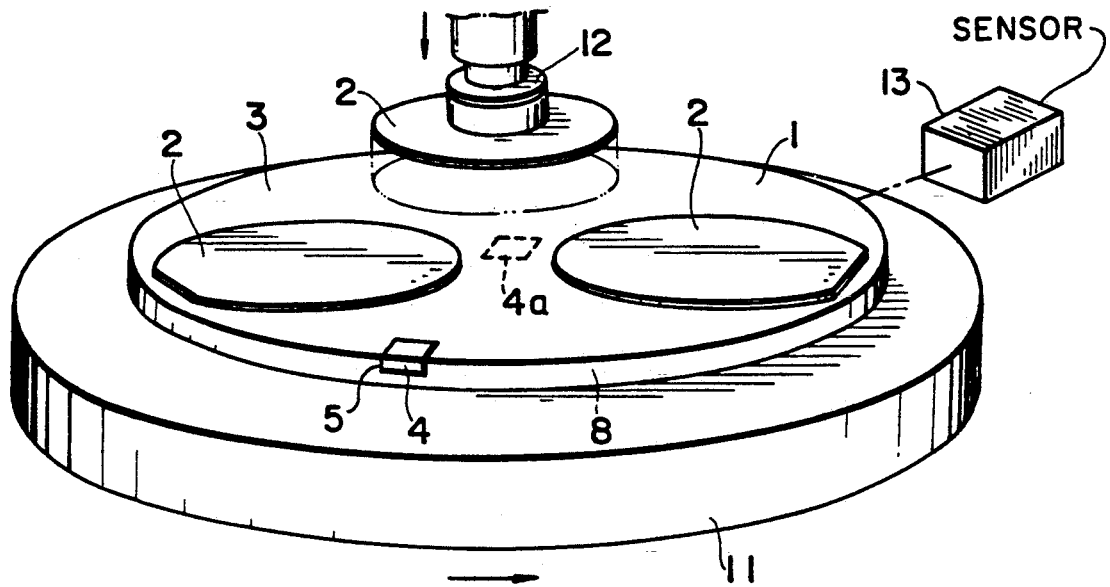
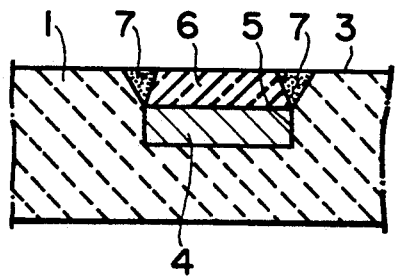
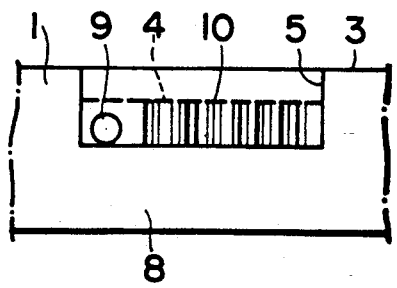

WAFER MOUNTING DEVICE HAVING POSITION INDICATOR

BACKGROUND OF THE INVENTION

Field of the Invention

The present invention relates generally to a wafer mounting device for mounting semiconductor wafers during fabrication of semiconductor devices, and more particularly to a wafer mounting device having a position indicator to enable wafers to always be mounted at the same locations on a mount plate.

Background Information

During semiconductor fabrication, semiconductor wafers are polished by means of a polishing apparatus to impart flat surfaces to the wafers. In the case of fabricating semiconductor elements on a wafer with a high degree of integration, it is important that the wafer surface be polished to an extremely flat finish. For this purpose, a plurality of wafers are mounted on a mount plate of a polishing apparatus by an automatic wafer mounting apparatus. One such wafer mounting apparatus is described, for example, in U.S. Pat. No. 4,960,485 issued Oct. 2, 1990 to Enya Mfg. Co., Ltd. To enable the mount plate to withstand the various polishing steps, the plate is typically made of a material which is chemically anti-corrosive and which can withstand aging and loading without significant deformation. In general, the mounting plate is made of a ceramic material or a heat-resistant and chemical-resistant glass material, such as that sold under the trademark Pyrex.

In operation, the mount plate is positioned on a rotatably indexable support. As the support is rotatably indexed, a plurality of semiconductor wafers are mounted one-by-one on the mount plate by the wafer mounting apparatus. Then the mount plate having the wafers mounted thereon is transferred to a polishing apparatus. The exposed upper surfaces of the wafers ar polished flat by the polishing apparatus, after which the wafers are removed from the mount plate. The mount plate is then removed from the rotary support, cleaned and used again to polish other wafers.

Due to repeated use, irregularities and unevenness develop in the wafer-mounting surface of the mount plate. For example, during mechanochemical polishing, particles which are softer than the semiconductor material of the wafers are used as polishing particles, and a solid-phase reaction occurs between the particles and the wafers. The reaction occurs at the contact surfaces between the polishing particles and the wafer and forms a foreign material which is removed as the polishing proceeds. In such a case, since a chemical reaction is used to effect polishing, those portions of the wafer-mounting surface on which the wafers are not mounted remain exposed and undergo a greater change than the portions on which the wafers are mounted. As a result, the wafer-mounting surface undergoes different degrees of change, a more pronounced change occurring at the non-wafer-mounted portions which are exposed to the chemical reaction and polishing than at the wafer-mounted portions and, therefore, an unevenness develops in the wafer-mounting surface.

As a consequence, if the positions at which the wafers are mounted on the wafer-mounting surface change during repeated use of the mount plate, it becomes impossible to mount the wafers uniformly due to the unevenness of the wafer-mounting surface. Therefore it is necessary to occasionally thinly grind the wafer-mounting surface of the mount plate to restore the surface flatness. The wafer-mounting surface is ground thinly to remove, for example, about several tens of microns so as to remove the surface unevenness. The need for occasional surface grinding of the mount plate is disadvantageous because it disrupts production, is time consuming, and increases the cost of manufacture.

SUMMARY OF THE INVENTION

An object of the present invention is to provide a wafer mounting device which overcomes the aforedescribed drawbacks and disadvantages of the prior art.

Another object of the present invention is to provide a wafer mounting device which ensures accurate mounting of wafers at the same predetermined locations during each use of the device.

A further object of the present invention is to provide a wafer mounting device having a mount plate equipped with means for ensuring that wafers are always mounted at the same locations on the mount plate during each use of the mount plate.

Another object of the present invention is to provide a wafer mounting device having a mount plate in which is embedded a position indicator to enable the mount plate to be indexed to the same initial start position during each use of the mount plate.

The above and other objects, features and advantages of the invention can be obtained by providing a rotary indexable mount plate having a disc-shaped body having a wafer-mounting surface on which semiconductor wafers are mounted for polishing. An indicator is embedded in the mount plate body, preferably at the peripheral side edge thereof, for indicating when the mount plate is indexed to a predetermined initial start position, thereby enabling the automatic positioning of the wafers at the same locations on the wafer-mounting surface during each use of the mount plate. The indicator is preferably inserted in a recessed portion of the mount plate body and is covered by a transparent material so that the indicator is visible through the transparent material. The indicator may comprise a marking of a different color than the surrounding region of the mount body, alphanumeric characters, bar code indications or the like.

Further objects, features and advantages of the invention will be apparent to those of ordinary skill in the art upon a reading of the following detailed description of the invention with reference to the accompanying drawings.

BRIEF DESCRIPTION OF THE DRAWINGS

FIG. 1 is a perspective view of a wafer mounting device according to the present invention;

FIG. 2 is an enlarged cross-sectional view of a portion of the wafer mounting device of FIG. 1 showing one embodiment of indicator and transparent cover and FIG. 3 is an enlarged side view of a portion of the wafer mounting device of FIG. 1 showing one embodiment of indicator.

DETAILED DESCRIPTION OF PREFERRED EMBODIMENTS

FIG. 1 shows a wafer mounting device according to one embodiment of the present invention. The device comprises a mount plate 1 having a wafer-mounting surface 3 for supporting thereon a plurality of semiconductor wafers 2. The mount plate 1 preferably has a disc shape and is composed of heat-resistant and chemical-resistant material, such as ceramic, glass such as that sold under the trademark Pyrex, or the like. The mount plate 1 has opposed major surfaces, the upper surface defining the wafer-mounting surface 3 and the lower surface being removably supported on a rotary support member 11.

The support member 11 is angularly driven by conventional indexing means (not shown) so that the mount plate 1 is angularly indexed to different angular positions to enable the wafers 2 to be mounted on the wafer-mounting surface 3. Wafer mounting means 12 is disposed above the mount plate 1 and constructed to undergo vertical displacement relative to the mount plate 1. The wafer mounting mean 12 is equipped with holding means, such as suction means (not shown), for releasably holding the wafers 2 to transfer them to the mount plate 1. By actuating the wafer mounting means 12 in synchronism with the angular indexing of the mount plate 1, the wafers 2 can be mounted on the wafer-mounting surface 3 in predetermined angularly spaced locations. The indexing means and the wafer mounting means may be, for example, of the type described in the aforesaid U.S. Pat. No. 4,960,485.

To enable the mount plate 1 to be indexed to the same angular positions during each loading of the wafers 2, it is necessary to begin the indexing of the mount plate 1 at the same initial start position each time. This will ensure that the indexing of the mount plate 1 is synchronized with the downward displacement of the wafer mounting means 12. For this purpose, the mount plate is provided with an indicator or indicating means 4. The indicating means 4 is preferably disposed in a predetermined position at the peripheral portion of the mount plate 1 at the intersection of the wafer-mounting surface 3 and the peripheral side edge 8 of the mount plate 1. Alternatively, an indicator or indicating means 4a may be provided at the central portion of the mount plate 1. In either case, the indicating means is embedded in the body of the mount plate 1 so that it will not be removed during surface grinding of the mount plate 1.

FIG. 2 is an enlarged cross-sectional view showing the indicating means 4 embedded in the body of the mount plate 1. In this embodiment, a recessed portion 5 is formed in the mount plate 1, and the indicating means 4 is inserted in the recessed portion 5. The depth or height of the recessed portion 5 is greater than that of the indicating means 4. A transparent covering material 6, such as ceramic or glass, is provided over the upper surface of the indicating means 4 and adhered to the body of the mount plate 1 by an adhesive 7. As shown in FIG. 2, the exposed upper surfaces of the transparent covering material 6 and adhesive 7 are coplanar and flush with the wafer-mounting surface 3 of the mount plate 1. Alternatively, instead of using a transparent covering material, the recessed portion 5 may be completely filled with the material of the indicating means 4. With either construction, surface grinding of the wafer-mounting surface 3 will not cause removal of the indicating means 4, which will remain visible throughout the useful life of the mount plate 1.

The indicating means 4 is preferably comprised of a material, such as ceramic or glass, that is relatively chemically inert to the polishing material. The indicating means 4 may have a color different from that of the surrounding portion of the mount plate 1 so that it is readily distinguishable. In the case of the FIG. 2 embodiment, the indicating mean 4 is clearly visible through the transparent covering material 6. As the indicating means 4 is deeply embedded in the body of the mount plate 1, it will not disappear during surface grinding of the wafer-mounting surface 3.

The indicating means 4 may comprise simply a marking. However, it is preferable that the marking be in the form of numerals, such as Arabic or European numerals or alphanumeric characters, or in the form of a bar code pattern to effect automatic control, such as control of the indexing of the mount plate 1. By way of example, the embodiment of the indicator 4 shown in FIG. 3 includes a dot marking 9 for use in positioning the mount plate 1 in a predetermined initial start position and a bar code marking 10 for use in effecting automatic control. If desired, the dot marking 9 may be eliminated and the endmost bar of the bar code marking 10 may be used as a position marking.

In operation, the mount plate 1 is placed on the rotatable support member 11 and removably held thereon, such as by suction. The support member 11 is then angularly displaced to a predetermined initial start position at which the position of the wafer mounting means 12 is synchronized with the position of the mount plate 1. The predetermined initial start position is detected by a sensor 13 which detects when the indicating means 4 is in a predetermined angular position corresponding to the initial start position of the mount plate 1. As shown in FIG. 1, the sensor 13 is disposed in radially spaced relation from the peripheral side edge 8 of the mount plate 1 and comprises an optical sensor of conventional construction. For example, the sensor 13 may include a light-emitting element for emitting light toward the indicating means 4 and a light-receiving element for receiving light reflected from the indicating means 4, or the sensor may include only a light-receiving element for receiving reflected light from the indicating means 4. If the indicating means 4 includes a bar code marking 10, the sensor may include a bar code reader or a separate bar code reader may be provided in conjunction with the sensor. Alternatively, the sensor 13 may be disposed at an elevation above the mount plate 1 to detect light reflected by the indicating means 4 or 4a. The spectral characteristics of the sensor 13 are chosen so that the sensor can readily distinguish between light reflected by the indicating means 4 and light reflected by other portions of the mount plate 1. As the support member 11 is angularly displaced, it reaches a position where light reflected by the indicating means 4 is detected by the sensor 13, whereupon the sensor 13 outputs a signl to terminate the angular displacement of the support member 11. In this manner, the support member 11 is stopped at a position corresponding the predetermined initial start position of the mount plate 1.

Once the mount plate 1 is positioned at the initial start position, the wafer mounting means 12 is lowered toward the mount plate 1, and the wafer 2 releasably held by the mounting means 12 is thereby mounted at a predetermined location on the wafer-mounting surface 3. Adhesive is applied to the bottom surface of the wafer 2 so that when the wafer is pressed onto the surface 3 by the wafer mounting means 12, it adheres thereto upon release from the mounting means 12. After the wafer 2 is mounted in its predetermined location on the mount plate 1, the wafer mounting means 12 is raised and receives the next wafer 2. In the interim, the support member 11 is rotated through a predetermined angle by the indexing means (not shown) to angularly displace the mount plate 1 to the next predetermined angular position in readiness for receiving the next wafer. The wafer mounting means 12 is then lowered to mount the next wafer 2 at a predetermined location on the wafer-receiving surface 3, and the cycle is repeated until all of the wafers 2 are mounted on the mount plate 1.

In this manner, each time the mount plate is used, the wafers 2 are always mounted on the wafer-mounting surface 3 at the same predetermined locations, thereby ensuring uniform conditions. By such a construction, wafers having high precision flatness can be obtained. The indicating means 4, by virtue of being embedded in the mount plate 1, remains visible even if the surface of the mount plate is thinly ground, thereby extending the useful life of the mount plate. Further, if a bar code or the like marking is used as the indicating means 4, such can be used to automatically control the polishing apparatus.

I claim:

1. A wafer mounting device for mounting semiconductor wafers to be polished, comprising: a mount plate angularly displaceable by displacing means about a given axis and having a wafer-mounting surface for mounting semiconductor wafers thereon at predetermined angularly spaced locations; and indicating means embedded in a predetermined position in the mount plate for indicating when the mount plate has been angularly displaced to a predetermined initial start position during each use of the mount plate to thereby enable semiconductor wafers to be mounted at the same predetermined locations on the wafer-mounting surface during each use of the mount plate.

2. A wafer mounting device according to claim 1; wherein the mount plate has a recessed portion; and the indicating means is disposed in the recessed portion of the mount plate.

3. A wafer mounting device according to claim 2; including a transparent covering material disposed in the recessed portion over the indicating means such that the indicating means is visible through the transparent covering material.

4. A wafer mounting device according to claim 3; wherein the upper surface of the transparent covering material is flush with the wafer-mounting surface of the mount plate.

5. A wafer mounting device according to claim 2; wherein the recessed portion is formed at a peripheral side edge of the mount plate.

6. A wafer mounting device according to claim 2; wherein the recessed portion is formed at a region where the wafer-mounting surface intersects a peripheral side edge of the mount plate.

7. A wafer mounting device according to claim 2; wherein the recessed portion is formed at the central portion of the wafer-mounting surface.

8. A wafer mounting device according to claim 2; wherein the indicating means comprises a marking.

9. A wafer mounting device according to claim 8; wherein the marking comprises a bar code marking.

10. A wafer mounting device according to claim 8; wherein the marking comprises a numeral marking.

11. A wafer mounting device according to claim 2; wherein the indicating means is composed of ceramic.

12. A wafer mounting device according to claim 2; wherein the indicating means is composed of glass.

13. A wafer mounting device according to claim 2; wherein the mount plate has a disc shape.

14. A semiconductor wafer mounting apparatus comprising: an angularly indexable support member; a mount plate removably supported on the support member to undergo angular indexing movement therewith, the mount plate having a wafer-mounting surface for supporting thereon at predetermined angularly spaced locations a plurality of wafers; wafer mounting means for individually mounting semiconductor wafers on the wafer-mounting surface; indicating means embedded in the mount plate for providing an indication of the angular position of the mount plate; and sensing means coacting with the indicating means for sensing when the mount plate has been angularly indexed to a predetermined initial start position so as to enable the wafer mounting means to thereafter mount wafers at the same predetermined locations on the wafer-mounting surface during each mounting of wafers on the mount plate.

15. A wafer mounting apparatus according to claim 14; wherein the mount plate has a recessed portion; and the indicating means is disposed in the recessed portion of the mount plate.

16. A wafer mounting apparatus according to claim 15; including a transparent covering material disposed in the recessed portion over the indicating means such that the indicating means is visible through the transparent covering material.

17. A wafer mounting apparatus according to claim 15; wherein the recessed portion is formed at a peripheral side edge of the mount plate.

18. A wafer mounting apparatus according to claim 15; wherein the indicating means comprises a marking.

19. A wafer mounting apparatus according to claim 18; wherein the marking comprises a bar code marking.

20. A wafer mounting apparatus according to claim 18; wherein the marking comprises a numeral marking.

* * * * *